(12) United States Patent
Yamaoka et al.

(10) Patent No.: US 6,862,227 B2
(45) Date of Patent: Mar. 1, 2005

(54) SEMICONDUCTOR MEMORY DEVICE HAVING THE OPERATING VOLTAGE OF THE MEMORY CELL CONTROLLED

(75) Inventors: Masanao Yamaoka, Hachioji (JP); Kenichi Osada, Kawasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/445,919

(22) Filed: May 28, 2003

(65) Prior Publication Data

US 2003/0223276 A1 Dec. 4, 2003

(30) Foreign Application Priority Data

May 30, 2002 (JP) ..................... P2002-156646

(51) Int. Cl.$^7$ ................. G11C 11/41; G11C 11/413; G11C 11/4193
(52) U.S. Cl. ................. 365/189.09; 365/189.11; 365/154; 365/226
(58) Field of Search ........... 365/189.09, 189.11, 365/226, 154

(56) References Cited

U.S. PATENT DOCUMENTS 6,075,404 A * 6/2000 Shindoh et al. .......... 327/537
6,125,075 A * 9/2000 Watanabe et al. ....... 365/230.06
6,256,252 B1 * 7/2001 Arimoto ...................... 365/227
6,265,932 B1   7/2001 Miyawaki ................... 327/535
6,288,967 B2 * 9/2001 Fujisawa et al. ............ 365/226
6,683,805 B2 * 1/2004 Joshi et al. .................. 365/156

FOREIGN PATENT DOCUMENTS

JP         6-139779        5/1994
JP         2000-268574     9/2000

* cited by examiner

Primary Examiner—Richard Elms
Assistant Examiner—J. H. Hur
(74) Attorney, Agent, or Firm—Mattingly, Stanger, Malur & Brundidge, P.C.

(57) ABSTRACT

An SRAM circuit which can be operated at a reduced operation margin, especially at a low operating voltage by increasing or optimizing the operation margin of the SRAM circuit. The threshold voltage of the produced transistor in the SRAM circuit is detected to compare the operating voltage of a memory cell with the operating voltage of a peripheral circuit in order to adjust it to the optimum value, and the substrate bias voltage is further controlled.

16 Claims, 10 Drawing Sheets

SEMICONDUCTOR MEMORY DEVICE HAVING THE OPERATING VOLTAGE OF THE MEMORY CELL CONTROLLED

BACKGROUND OF THE INVENTION

1. Field of the Invention

The present invention relates to a semiconductor integrated circuit having a static memory (SRAM) circuit integrated on a semiconductor chip. More specifically, it relates to constitution for reducing the operating voltage of a SRAM integrated circuit device.

2. Description of Related Art

JP-A 139779/1994 discloses a circuit for comparing the threshold voltage of the transistor of a memory cell with a preset reference voltage and generating a substrate bias voltage so that the threshold voltage becomes equal to the reference voltage. JP-A268574/2000 discloses a circuit for changing a substrate bias voltage using signals from a threshold value detection circuit and from a voltage detection circuit for transistors to approximate the threshold value of the transistor of a memory cell to a preset value.

The operating voltages of large scale integrated circuits (LSIs) are decreasing due to reductions in the power consumption of LSIs and the process pattern rule of transistors in the LSIs. For example, an LSI which operates at a operating voltage of 1.2 V is produced at a process pattern rule of 0.13 $\mu$m. To reduce the operating voltage of the LSI, the current of a transistor is increased by reducing the threshold voltage of the transistor in order to prevent deterioration in circuit performance (working speed of a circuit). When the threshold voltage of the transistor is reduced, the static noise margin (SNM) which is the operation margin for reading the data of a SRAM memory cell becomes small, thereby making it difficult to operate the circuit. When the operating voltage is further reduced, the operation margin for not only reading but also writing becomes smaller with the result that the SRAM circuit does not operate. Therefore, the operation margin for reading and writing data from and to the SRAM memory cell must be made large even at a low operating voltage.

SUMMARY OF THE INVENTION

The operation margin for reading and writing is controlled by using a semiconductor memory which comprises an array of a plurality of static memory cells, a peripheral circuit for controlling the above memory array, and a circuit for changing the operating voltage of the above memory array according to the threshold voltage of a transistor in each of the above static memory cells. Since the operation margin changes according to the performance of the transistor, after the production of an LSI or during the operation of the LSI, the threshold voltage of the transistor is detected to determine the optimum operating voltage for the memory array so as to apply the optimum voltage to the memory array. As alternative means, the characteristics of the transistor after the production of an LSI are detected to adjust the operating voltage for the memory array and further substrate potentials for transistors in the memory cell in order to vary the threshold value of transistors constituting the memory cell. The line suppling the operating voltage of the memory array and the line suppling the operating voltage of the peripheral circuit are separated from each other, and a voltage corresponding to the threshold voltage of the transistors in the memory array is added to the operating voltage of the peripheral operating voltage to the memory array. Thus, different voltages can be applied to the memory array and the peripheral circuit.

DETAILED DESCRIPTION OF THE PREFERRED EMBODIMENTS

Embodiment 1

Figure 1:
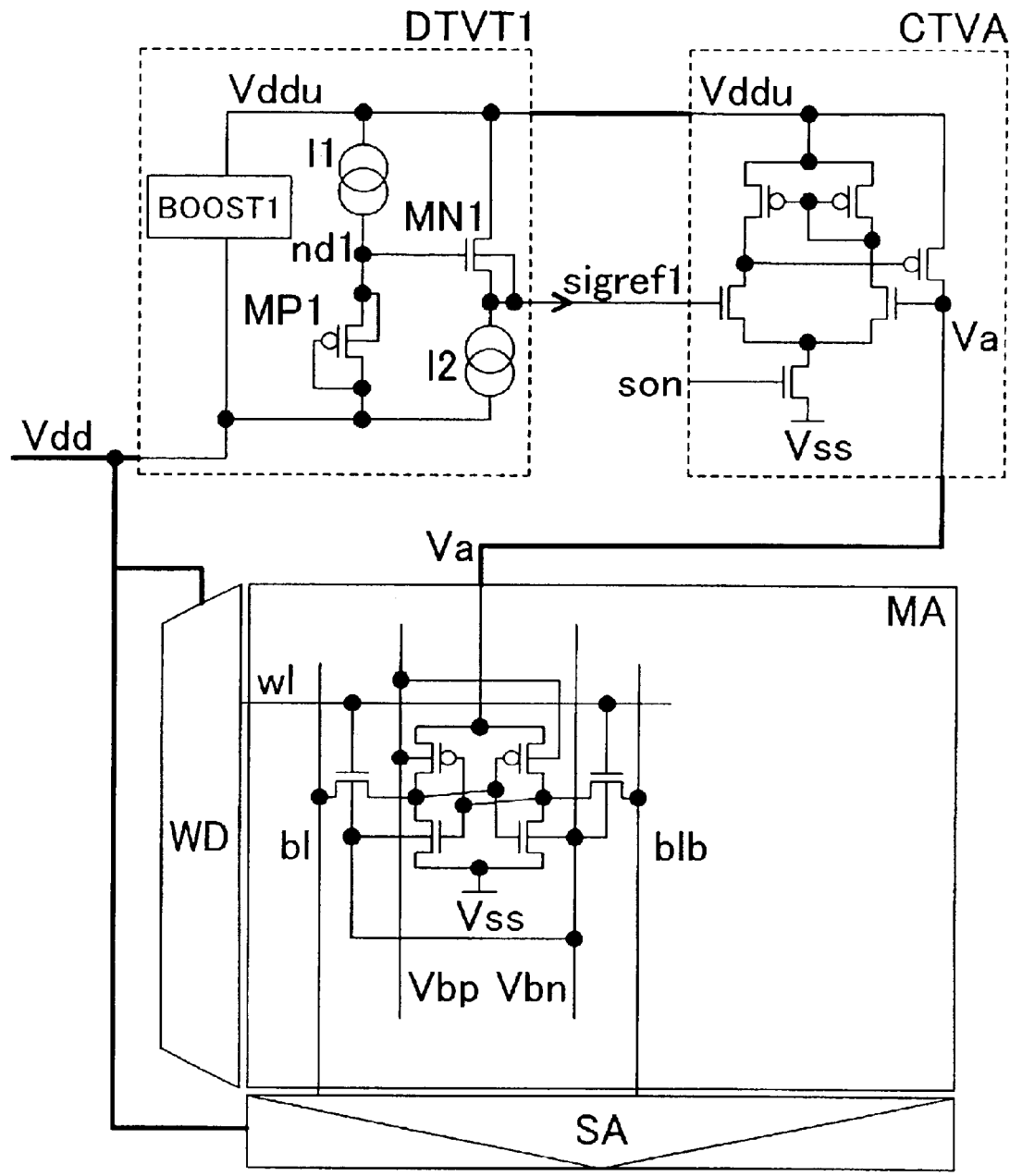
FIG. 1 is a schematic diagram of the SRAM circuit and the voltage controlling circuit according to the present invention.

FIG. 1 schematically shows a SRAM circuit and its power constitution according to the present invention. In FIG. 1, MA is an array of SRAM memory cells, WD is a circuit for controlling the word line, a word driver or a row address decoder, SA is a circuit for controlling the bit line, a sense amplifier, precharging circuit or column decoder, DTVT1 is a circuit which detects the threshold voltage of pMOS and nMOS transistors and generates reference potential signal sigref1 for generating the operating operating voltage of the memory array, and CTVA is a power circuit for outputting an operating voltage Va of the memory array by increasing or reducing the operating voltage Vdd based on the signal sigref1 from DTVT1. W1 in the memory array MA is the word line of a memory cell, b1 and b1*b* are bit lines, Vss is a ground potential line, Vbp is a node connected to the substrate electrode of a pMOS transistor in the memory cell, and Vbn is a node connected to the substrate electrode of nMOS transistors in the memory cell. The memory cell is composed of a flip-flop (having two p-channel load MOS transistors and two n-channel drive MOS transistors) constructed by interconnecting the inputs and outputs of a pair of CMOS inverters, and two n-channel transfer MOS transistors for selectively connecting the two memory nodes of the flip-flop to data lines. A word line is connected to the gate electrode of the two n-channel transfer MOS transistors, and the substrate potentials of the n-channel drive MOS transistors and n-channel transfer MOS transistors are controlled by the same signal line. This is because the n-channel transfer MOS transistor and the n-channel drive MOS transistor are formed in the same well, thereby making it possible to easily control the substrate potential. When the above n-channel transfer MOS transistor and the n-channel drive MOS transistor are formed in different wells and different control signals are given thereto, changes of the threshold voltages of the both transistors can be adjusted independently L1 and 12 in the reference potential generating circuit DTVT1 are constant current sources, BOOST1 is a booster circuit, Vthp1 is the threshold voltage of pMOS transistor MP1, Vthn1 is the threshold voltage of nMOS transistor MN1, Vdd is the operating voltage of the peripheral circuit, and nd1 is a node connected to the source electrode of MP1. The above pMOS transistor and nMOS transistor are produced through the same process as the pMOS load transistor, nMOS drive transistor and nMOS transfer transistor in the above memory cell. So, oxide film thickness and the density of impurity implantation are the same. Therefore, there is a certain proportional relationship between the threshold voltage of the transistor used in DTVT1 and the threshold voltage of the transistor used in MA. For example, when the threshold voltage of the transistor in MA increases, the threshold voltage of the transistor in DTVT1 rises and when the threshold voltage of the transistor in MA decreases, the threshold voltage of the transistor in DTVT1 drops. It is possible to facilitate the detection of a change in the threshold value by changing the gate length and gate width from those of the memory cell. Thereby, the threshold value of the transistor can be detected without affecting the memory cell itself. Vddu in the voltage control circuit CTVA is a voltage higher than the maximum voltage of memory array power Va, and Vss is a ground potential. L1 and 12 in DTVT1 are current sources having the same amount of a current. Vddu is generated by increasing Vdd. Vdd is supplied to the booster circuit BOOST1 to increase the voltage. BOOST1 is a circuit composed of a charge pump circuit using a capacitor and the like. The potential of the node nd1 rises by the threshold value of the pMOS transistor MP1 from Vdd to become Vdd+Vthp1. The node nd1 is connected to the gate electrode of the nMOS transistor MN1, thereby the potential of the source electrode of MN1 becomes Vdd+Vthp1−Vthn1, and a voltage obtained by adding the operating voltage of the peripheral circuit to the difference between the threshold voltage of the pMOS transistor and the threshold voltage of the nMOS transistor is output as sigref1.

Therefore, when the absolute value of threshold voltage of the pMOS transistor becomes higher than the absolute value of threshold voltage of the nMOS transistor in DTVT1, the operating voltage of the memory array can be increased and when the absolute value of threshold voltage of the pMOS transistor becomes lower than the absolute value of threshold voltage of the nMOS transistor, the operating voltage of the memory array can be reduced. In a normal SRAM memory cell, when the threshold voltage of the nMOS transistor is fixed, if the threshold voltage of the pMOS transistor becomes high, the write margin becomes large and if the threshold voltage of the pMOS transistor becomes low, the write margin becomes small. Therefore, it is possible to operate the SRAM circuit in consideration of a change in the write margin by controlling the voltage of the memory array with the circuit in the figure By using circuit DTVT1, changes in the threshold voltages of the transistors caused by varing the temperature of the LSI during the operation of the circuit is reflected to the operating voltage of the memory array and a reduction in the operation margin caused by the change in the characteristics of the transistors in operation can be compensated. The voltage control circuit CTVA compares the voltage of the input signal sigref1 with the output voltage Va in order to adjust Va so that the voltage of sigref1 becomes equal to Va and applies a voltage obtained by adding the threshold voltage of the pMOS transistor to the operating voltage of the peripheral circuit and subtracting the threshold voltage of the nMOS transistor from the obtained result to the operating voltage of the memory array. When a high potential is applied to son during operation, the power circuit CTVA is activated. When a low potential is applied to son, the circuit CTVA is not activated and when the circuit is out of operation, the consumption power can be reduced by making son low in potential. When the circuit DTVT1 and the circuit CTVA are used, the voltage of the memory array power Va is increased or reduced by a voltage equal to the difference between the threshold voltage of the pMOS transistor and the threshold voltage of the nMOS transistor. When the threshold voltage of the pMOS transistor is higher than the threshold voltage of the nMOS transistor, the voltage of the memory array power Va is increased and when the threshold voltage of the pMOS transistor is lower than the threshold voltage of the nMOS transistor, the voltage is reduced. In the circuit of FIG. 1, the voltage Vdd is supplied to the peripheral circuits WD and SA of the SRAM circuit, and the circuit DTVT1. The circuit DTVT1 outputs a reference potential. The operating voltage Vddu which is boosted from the operating voltage Vdd is generated by the booster circuit in DTVT1 and is supplied to the circuit DTVT1 generating the reference potential and to the circuit CTVA outputting the operating voltage Va. The operating voltage Va outputted by CTVA is supplied to the memory cell array MA. While the circuit is in operation, the threshold voltage detector circuit DTVT1 detects differences from the designed and the threshold voltages of the nMOS transistor and the pMOS transistor in the LSI, and outputs signal sigref1 to CTVA to apply optical voltage to the memory array. The voltage control circuit CTVA changes Vddu so that the operating voltage Va of the memory array becomes the value of the input signal sigref1 and applies it to the memory cell array as operating voltage Va. Thereby, the operating voltage margin of the memory cell becomes large and operation at a low voltage becomes possible. In FIG. 1, the operating voltage of the memory array peripheral circuit is increased by using the boosting circuit. A voltage reducing circuit using a transistor or like connected to a diode may be included in DTVT1 or CTVA to reduce the operating voltage. Further, it is needless to say that, after the voltage to be applied to the above memory array is reduced, a boosted voltage may be generated.

Figure 2:
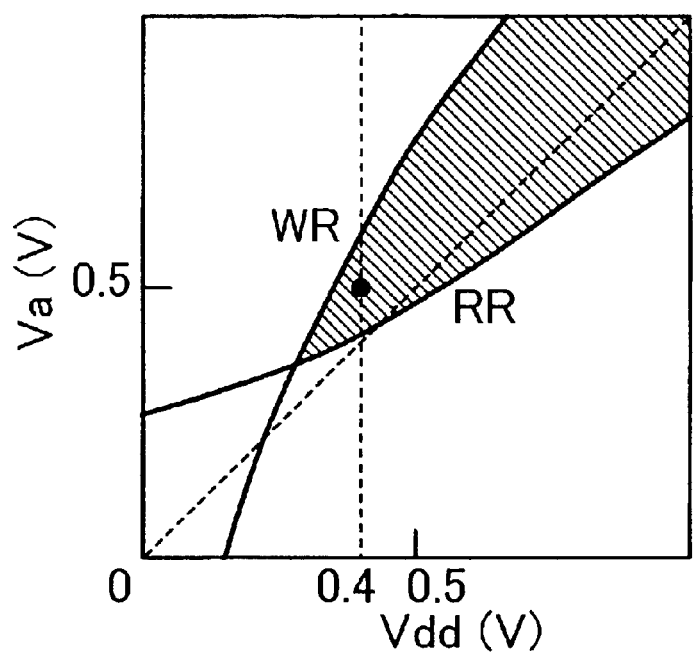
FIG. 2 is a graph showing the relationship between the operating voltage of a peripheral circuit and the operating voltage of a memory cell array when the SRAM circuit operates.
Figure 3:
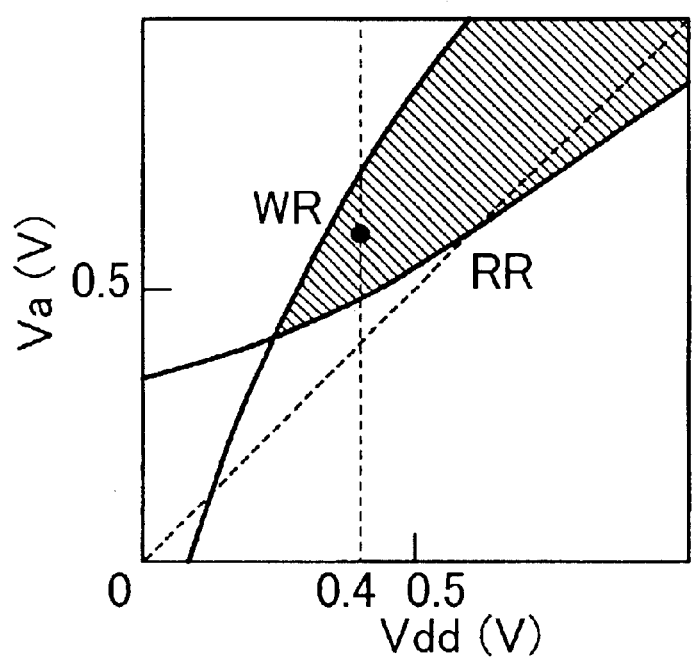
FIG. 3 is a graph showing the relationship between the operating voltage of a peripheral circuit and the operating voltage of a memory cell array when the SRAM circuit operates. The characteristics of transistors are changed from those shown in FIG. 2.
Figure 4:
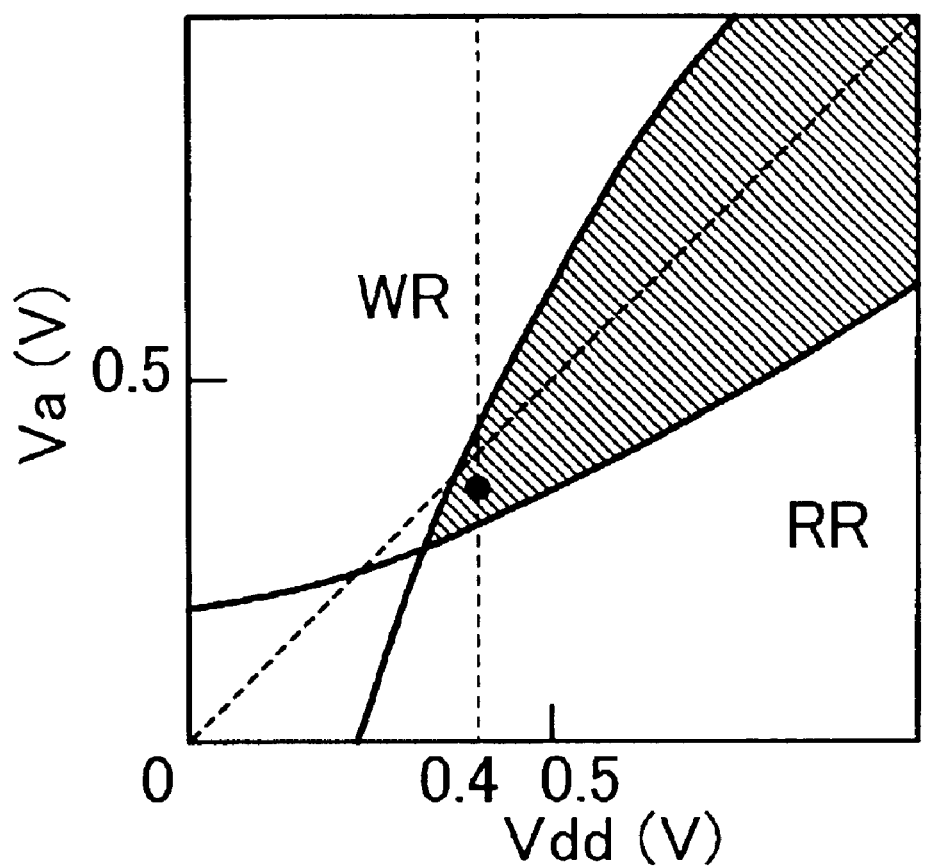
FIG. 4 is a graph showing the relationship between the operating voltage of a peripheral circuit and the operating voltage of a memory cell array when the SRAM circuit operates. The characteristics of transistors are changed from those shown in FIG. 2 and FIG. 3.

For example, FIG. 2 shows the relationship between the operating voltage Vdd of the peripheral circuit and the operating voltage Va of the memory array. The curve RR shows a limit voltage at which read operation slows down and cannot be carried out, read operation is carried out properly in an area having higher Va than RR (upper middle area in FIG. 2), and read operation cannot be carried out properly in an area having lower Va than RR. The curve WR shows a limit voltage at which write operation slows down and cannot be carried out, write operation is carried out properly in an area having higher Vdd than WR (right middle area in FIG. 2) and write operation cannot be carried out properly in an area having lower Vdd than WR. Read and write operations can be carried out in the shaded section in the figure. Therefore, when the memory cell in FIG. 2 is designed to be operated at Vdd=0.4 V and operated at a Va of about 0.5 V, that is, a voltage shown by a black point in the figure, the maximum voltage margin can be obtained. However, when the characteristics of the memory cell become as shown in FIG. 3 due to a gap in the performance of the transistor at the time of production, there is almost no voltage margin at Va=0.5 V. It is understood that when the memory cell is operated at an increased Va of about 0.6 V, a large voltage margin can be obtained. Therefore, by changing Va to 0.6 V in the circuit of FIG. 1, the operation margin of the SRAM circuit is made large. It is also understood that when the characteristics of the memory cell become as shown in FIG. 4 unlike FIG. 3, writing to the memory cell is not carried out properly in an area where Va>0.5 V and when the memory cell is operated at a reduced Va of about 0.35 V lower than Vdd, a large voltage margin can be obtained. In this case, by changing Va to 0.35 V in the circuit of FIG. 1, the operation margin of the SRAM circuit is made large. Thus, in the present invention, it is possible to rate the performance of a transistor which differs in the production process by mounting a circuit capable of detecting the threshold value of the transistor on the same chip or wafer and to supply an operating voltage in consideration of the characteristics of the transistor used in the memory cell to the memory array.

Figure 5:
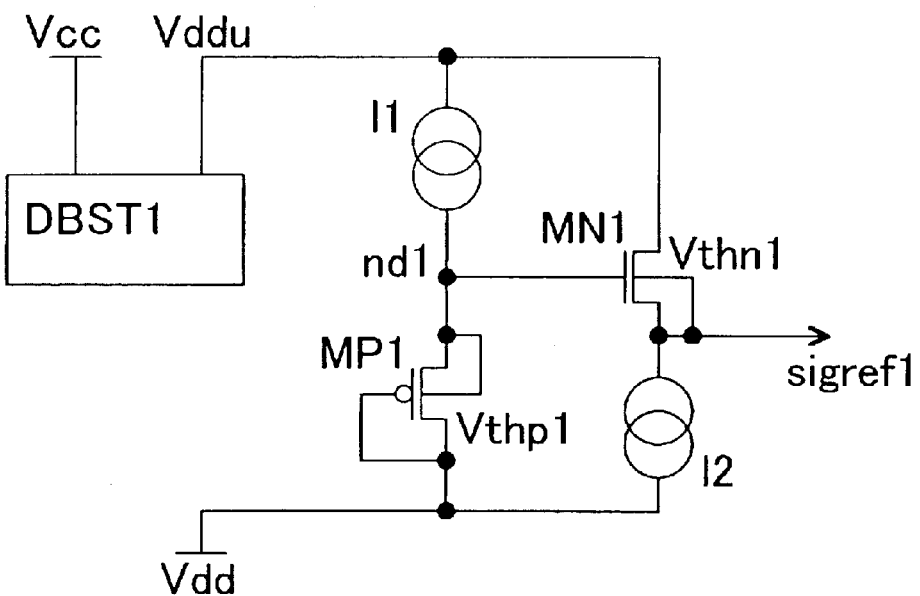
FIG. 5 is a circuit diagram showing an example of a voltage controlling circuit CTVA in FIG. 1.

FIG. 5 shows another example of the DTVT1 circuit. The circuit of FIG. 5 is almost equivalent to the circuit DTVT1 in FIG. 1 and differs from the circuit DTVT1 in the method of generating Vddu higher than Vdd. Currently, a generally produced LSI is operated by using two different operating voltages for an internal circuit and an input/output circuit. In FIG. 5, Vdd is an operating voltage for the internal circuits and Vcc is an operating voltage for the input/output circuit. Vcc is a higher voltage than Vdd. DBST1 is a voltage reducing circuit which reduces Vcc using a transistor or the like connected to a diode to generate Vddu higher than Vdd. When the voltage Vcc is not so large as Vdd, Vcc can be used as Vddu directly without using the voltage reducing circuit. Vddu is used in the circuit of FIG. 6 et seq. The circuit DTVT1 in FIG. 1 or the circuit in FIG. 5 may be used to generate Vddu. When the DTVT1 in FIG. 1 and the circuit in FIG. 5 are used at the same time, DTVT1 and the voltage increasing or reducing circuit in FIG. 5 may be used at the same time.

Although the operating voltage Vdd for the internal circuit and the operating voltage Vcc for input/output are used in FIG. 5, the operating voltage Vcc for input/output is connected to the voltage reducing circuit to be used as the operating voltage for the internal circuit.

Figure 6:
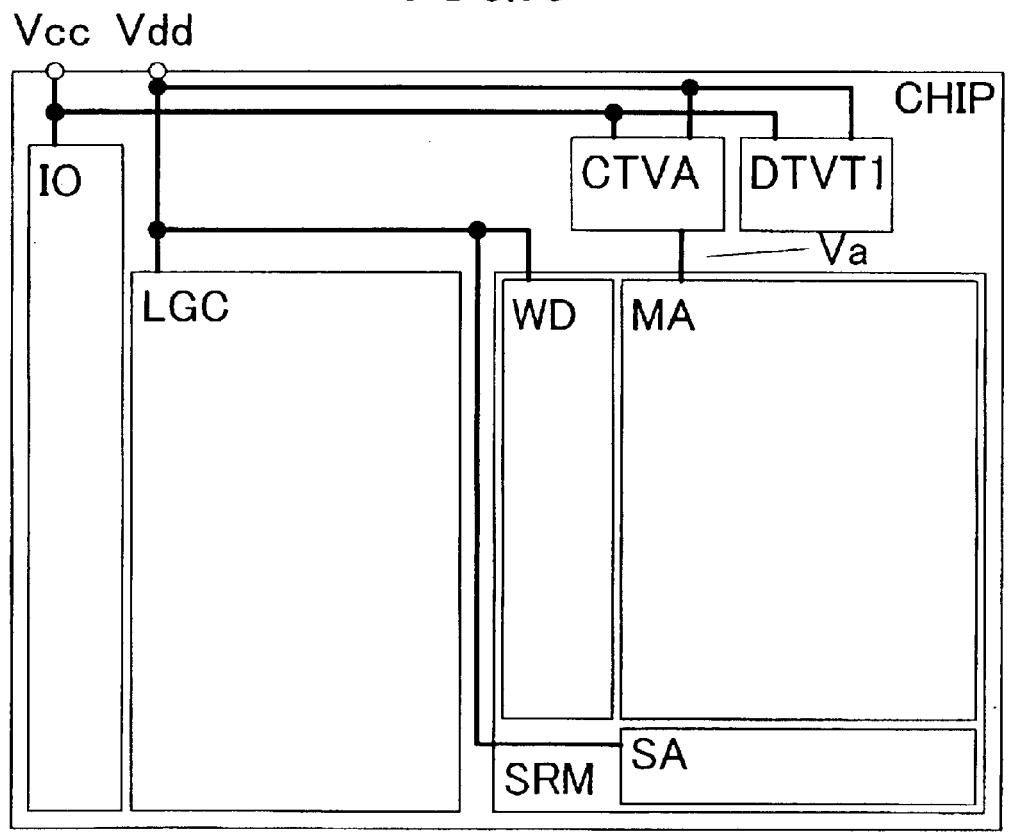
FIG. 6 is a schematic diagram of the circuit arrangement and power arrangement of a system LSI according to the present invention.

FIG. 6 shows the system LSI including the relationship of operating voltages when the circuit in FIG. 1 is used. The system LSI is a circuit having a memory circuit and a logic circuit which are currently widely produced integrated thereon. FIG. 6 shows the circuit constitution of the system LSI. The constitution of a memory LSI having no logic circuit can be considered as identical to the system LSI when a logic circuit is excluded. In FIG. 6, a chip which is the system LSI has a logic circuit LGC for carrying out predetermined processing on data, a static memory circuit SRAM for storing data, a circuit DTVT1 for detecting the threshold voltage of a transistor, and a circuit CTVA for generating the operating voltage for a memory array. The SRAM circuit SRM comprises a memory cell array MA and peripheral circuits WD and SA. The operating voltage Vdd of the internal circuit is applied from the outside of the LSI and supplied to LGC, WD, SA, CTVA and DTVT1. The voltage Vcc for the input/output circuit higher than Vdd is applied from the outside and supplied to IO and also CTVA and DTVT1, and an operating voltage different from Vdd for the memory array is generated in CTVA using the voltage and supplied to the memory array MA.

Figure 14:
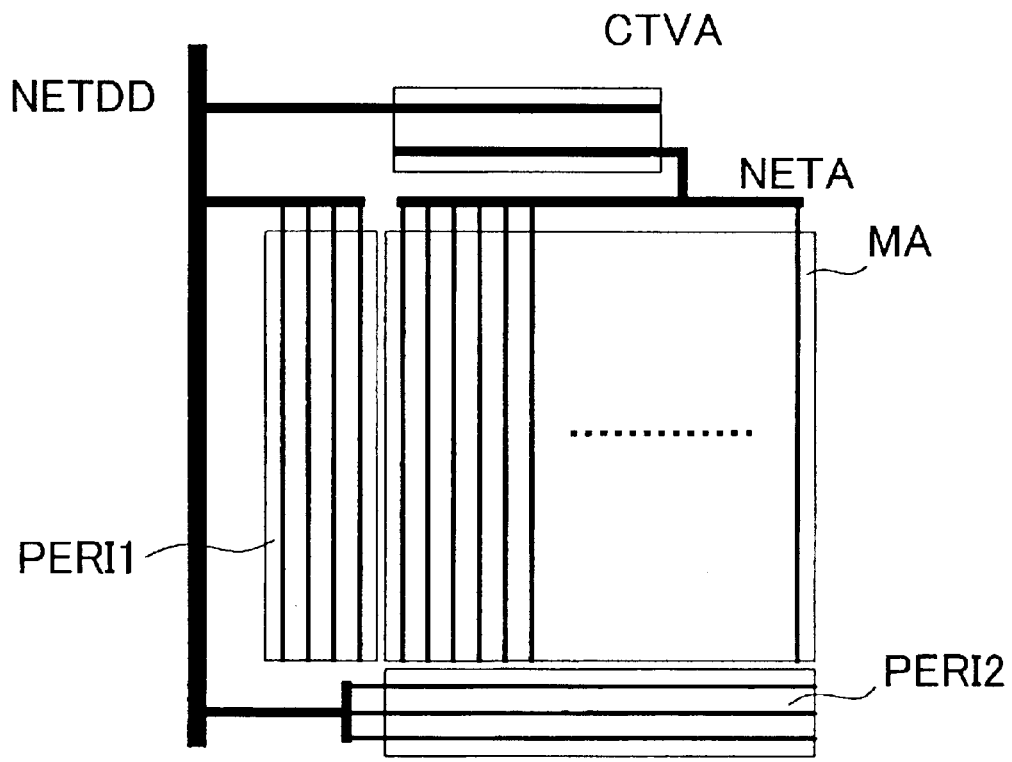
FIG. 14 is a diagram showing the layout of the power wirings of a SRAM circuit.

FIG. 14 shows the layout of the power wiring of the SRAM circuit according to the present invention. In FIG. 14, NETDD is a power network for the internal circuit and has a voltage Vdd, NETA is a power network for the memory cell array and have a voltage Va, MA is a SRAM memory cell array, PERI1 and PERI2 are circuits other than the memory cells in the SRAM circuit and including a word driver and sense amplifier, and CTVA is a voltage changing circuit for changing the operating voltage Vdd to generate an operating voltage Va for the memory array. The power network NETA for the memory array supplies an operating voltage Va to the memory cells in the memory array, is separate from the power network NETDD for the peripheral circuits and is connected only to the voltage changing circuit CTVA and the memory array MA.

In Embodiment 1, the optimum voltage is applied to the memory array by changing the potential of the source node of the p load MOS transistor on a high potential side of the memory array. The ground potential Vss of the source node of the n drive MOS transistor on a low potential side may be increased or decreased. This can apply to Embodiment 2 and others.

Embodiment 2

Figure 7:
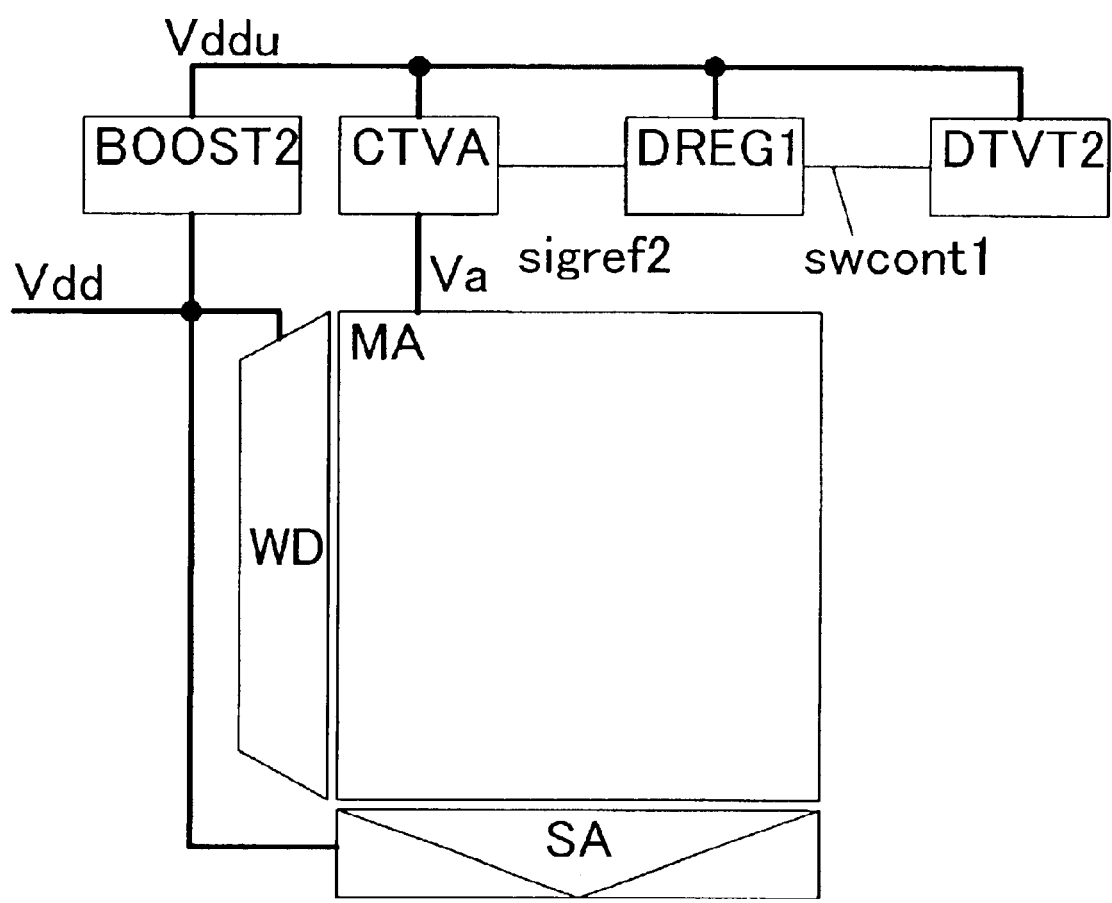
FIG. 7 is a schematic diagram of the circuit constitution and power constitution of a SRAM circuit according to the present invention different from those of FIG. 1.

FIG. 7 schematically shows another SRAM circuit and its voltage control constitution. In FIG. 7, MA is an array of SRAM memory cells, WD is a circuit for controlling the word line, a word driver, and row address decoder, SA is a circuit for controlling the bit line, a sense amplifier, precharger circuit and column decoder, BOOST 2 is a booster circuit for increasing Vdd to generate voltage Vddu, CTVA is a voltage controlling circuit for outputting an operating voltage Va for the memory array based on a reference potential signal sigref2, DREG1 is a circuit for outputting a reference potential specified by a reference potential selection signal swcont1, and DTVT2 is a circuit for outputting a reference potential selection signal swcont1 in accordance with the threshold voltages of transistors. During the operation of this circuit, the threshold voltage detection circuit DTVT2 outputs a signal swcont1 for selecting the optimum voltage for the memory array based on the threshold voltages of an nMOS transistor and a pMOS transistor and the reference potential output circuit DREG1 outputs the optimum voltage for the memory array as a reference potential signal sigref2 in response to swcont1. The power circuit CTVA outputs a voltage equal to the reference potential signal sigref2 as the memory array operating voltage Va. Thereby, the operating voltage margin of the memory cells can be made large and the memory cells can be operated at a low voltage.

Figure 8:
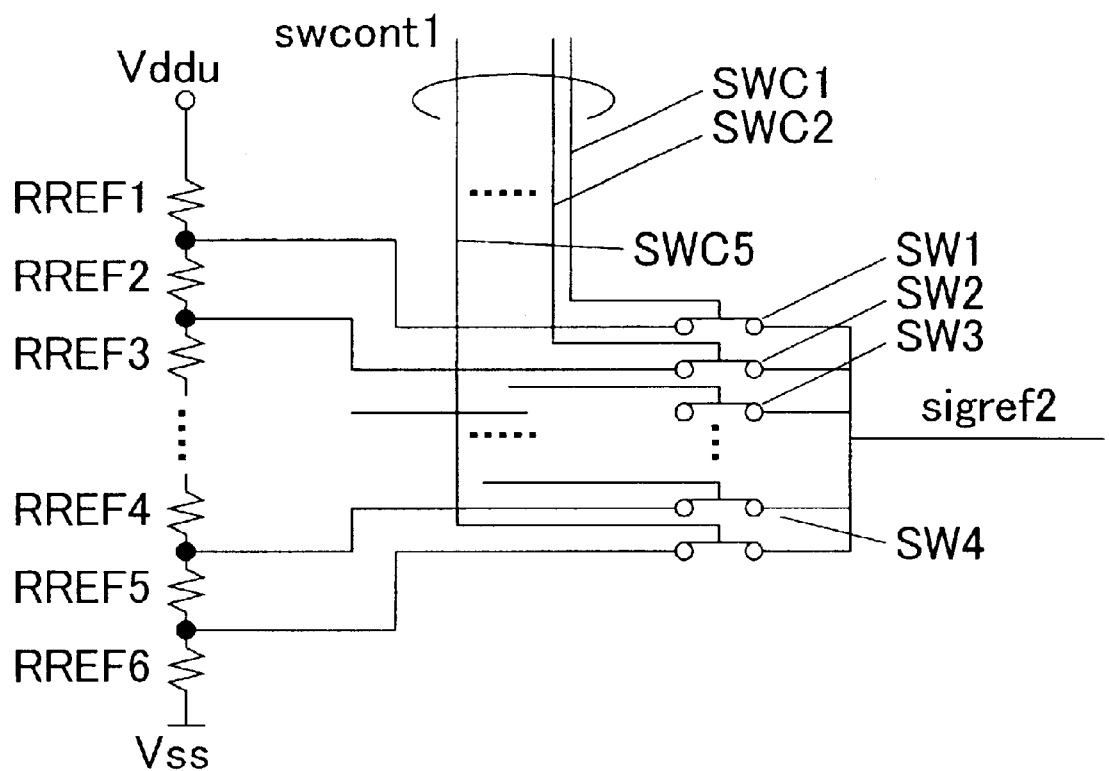
FIG. 8 is a circuit diagram showing an example of a reference voltage output circuit DREG1 in FIG. 7.

FIG. 8 shows an example of the circuit DREG1 for outputting a reference potential. In FIG. 8, RREF1 to RREF6 are resistors and SW1 to SW5 are switches which are opened or closed by a control signal swcont1. FIG. 8 illustrates six resistors PREF1 to PREF6. Actually, an optimum number of resistors are used. In FIG. 8, the resistors RREF1 to RREF6 divide a potential between Vddu and Vss to generate potentials which might be applied to the memory array. A node divided by the resistors is connected to an output node through the switches SW1 to SW5, and the potential of the signal sigref2 is determined by the signal swcont1 generated by detecting the threshold voltages of the transistors and output. The signal swcont1 is a signal having a number of bits corresponding to the switches SW1 to SW5, and SWC1 to SWC5 are buses for transferring the signal swcont1.

Figure 9:
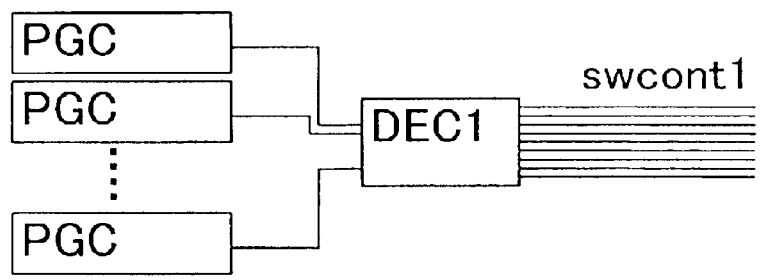
FIG. 9 is a schematic diagram showing an example of a circuit DTVT2 for outputting a signal for controlling the reference voltage output circuit DREG1 based on the threshold voltage of a MOS transistor in FIG. 7.

FIG. 9 shows an example of the control circuit DTVT2. In FIG. 9, PGC is a program element, and DEC1 is a circuit for decoding data having a number of bits corresponding to PGC's to convert it into the control signal swcont1. A nonvolatile program element such as a metal fuse or flash memory is used as PGC, the transistor characteristics of the LSI completed at the time of testing are measured after the production of the LSI, the optimum voltage Va for the memory array is determined, and a value for obtaining the voltage is written to PGC so that the LSI is operated at the optimum voltage for the memory array. Since nonvolatile program elements are used in the circuit of FIG. 9, the step of storing the characteristics of the transistors is required after production.

The program elements store data for controlling the reference potential according to the threshold voltage of the transistor. A combination of a circuit for detecting the threshold voltages of transistors, a circuit for outputting a reference threshold voltage for comparison and two voltage comparator circuits can have the same operation function as these memory circuits. When these circuits are used, as soon as the power is turned on, the threshold voltages of transistors and the designed reference threshold voltages are compared with each other, and the control signal swcont1 is generated so that the optimum voltage for the memory array is obtained based on the comparison result.

Figure 10:
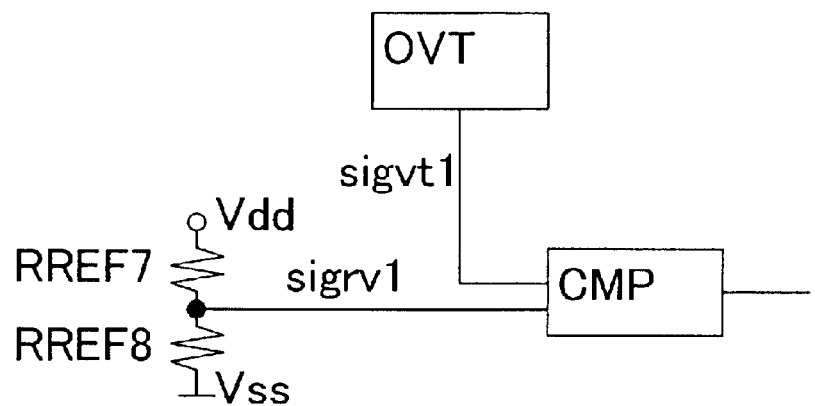
FIG. 10 is a schematic diagram showing an example of the threshold detection circuit of a transistor replacing program circuits PGC in FIG. 9.

FIG. 10 shows an example of a circuit as a substitute for a program circuit PGC in FIG. 9. In FIG. 10, OVT is a circuit for detecting the threshold voltage of a MOS transistor and outputting it as a signal sigvt1. CMP is a circuit comparing two input signals and outputting a high or low signal. In the circuit of FIG. 10, CMP generates a reference potential for comparing threshold voltages from the resistors RREF7 and RREF8 to compare the reference potential for comparison with the actual threshold voltage of transistors, and detect the threshold voltages of the transistors by outputting the comparison result, which is the result of camparing the reference potential and the actual threshold voltage of the transistors. This circuit does not need to output the actual threshold but needs to output a voltage which changes by the threshold voltage, the potential of the signal sigrv1 is determined by the voltage, and the resistance values of RREF7 and RREF8 are determined by the potential. For example in FIG. 10, whether the threshold voltages of the transistors are higher or lower than 0.5 V is judged by designing the resistance values of RREF7 and RREF8 to make the potential of sigrv1 to be 0.25 V, if OVT is a circuit for outputting a potential which is ½ the threshold voltages of the transistors as sigvt1 Since the potential of sigrv1 is 0.25 V during the operation of the circuit and the potential which is half the threshold voltage of the transistor is output as sigvt1, when sigvt1 is higher than 0.25 V, that is, the threshold voltage of the MOS transistor is higher than 0.5 V, a high signal is output from CMP, and when the threshold voltage of the MOS transistor is lower than 0.5 V, a low signal is output from CMP. Therefore, the circuit of FIG. 10 can replace a circuit for storing data based on the threshold voltage of the transistor.

In the case of a circuit using a program circuit, the characteristics such as the threshold voltages of the transistors are measured and stored in the program circuit after the production of the LSI. Therefore, although changes in characteristics at the time of producing the LSI can be corrected, changes in the characteristics of the transistor caused by temperature variations and the like during the operation of the LSI cannot be corrected. However, since the relationship between the threshold voltage and the voltage of the memory array can be determined after production, the operating voltage of the memory array can be determined under conditions different from design conditions. When the circuit of FIG. 10 is used, as the characteristics of the transistor during the operation of the LSI are detected, changes in the characteristics of the transistor caused by varing temperature and the like during the operation of the LSI can be corrected, and the operation margin can be made large.

Embodiment 3

Figure 11:
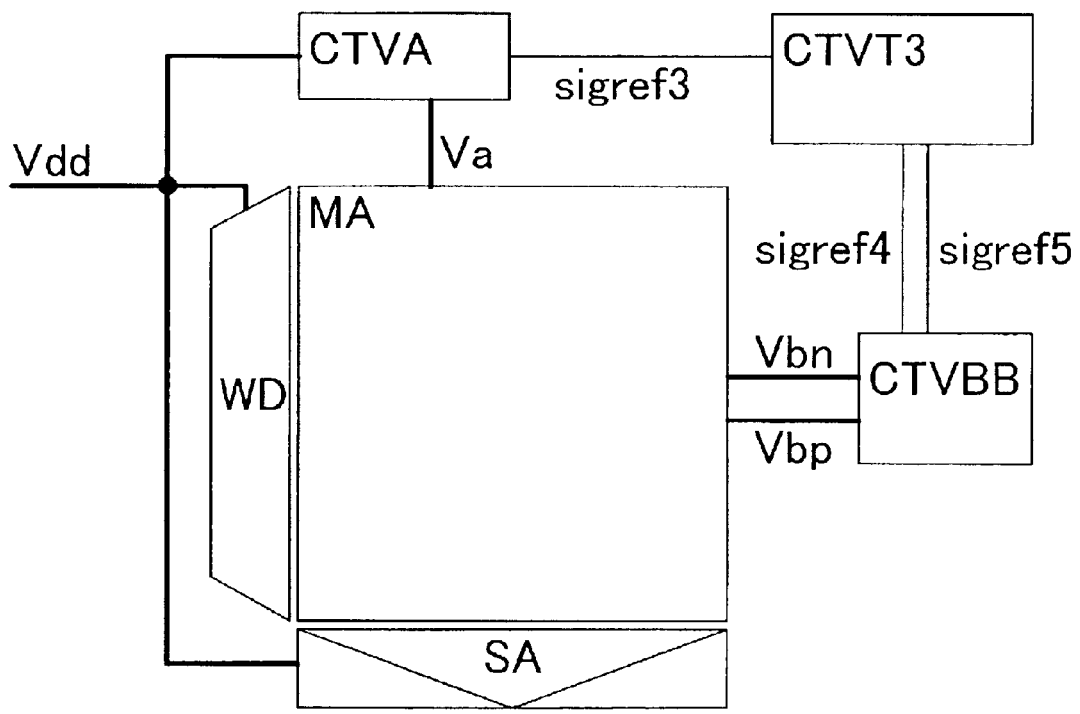
FIG. 11 is a schematic diagram of a circuit for controlling the circuit constitution, power constitution and substrate potential of a SPAM circuit according to the present invention.

FIG. 11 schematically shows still another SRAM circuit according to the present invention. In FIG. 11, MA is an array of SRAM memory cells, WD is a circuit for controlling the word line, a word driver, row address decoder, SA is a circuit for controlling the bit line, a sense amplifier, precharger circuit and column decoder, DTVT3 is a circuit for detecting the threshold voltages of transistors and generating a reference potential signal sigref3 for generating an operating voltage for the memory array and reference potential signals sigref4 and sigref5 for generating substrate potentials for the memory array, CTVA is a voltage control circuit for increasing or reducing the operating voltage Vdd based on the signal sigref3 from DTVT3 to apply an operating voltage Va to the memory array, and CTVBB is a circuit for generating Vbn and Vbp which are substrate potentials for the memory array in response to the signals sigref4 and sigref5 from DTVT3. Vbn is a potential for p well which is the substrate of the nMOS transistors of the memory cell and Vbp is a potential for n well which is the substrate of the pMOS transistors of the memory cell.

Figure 12:
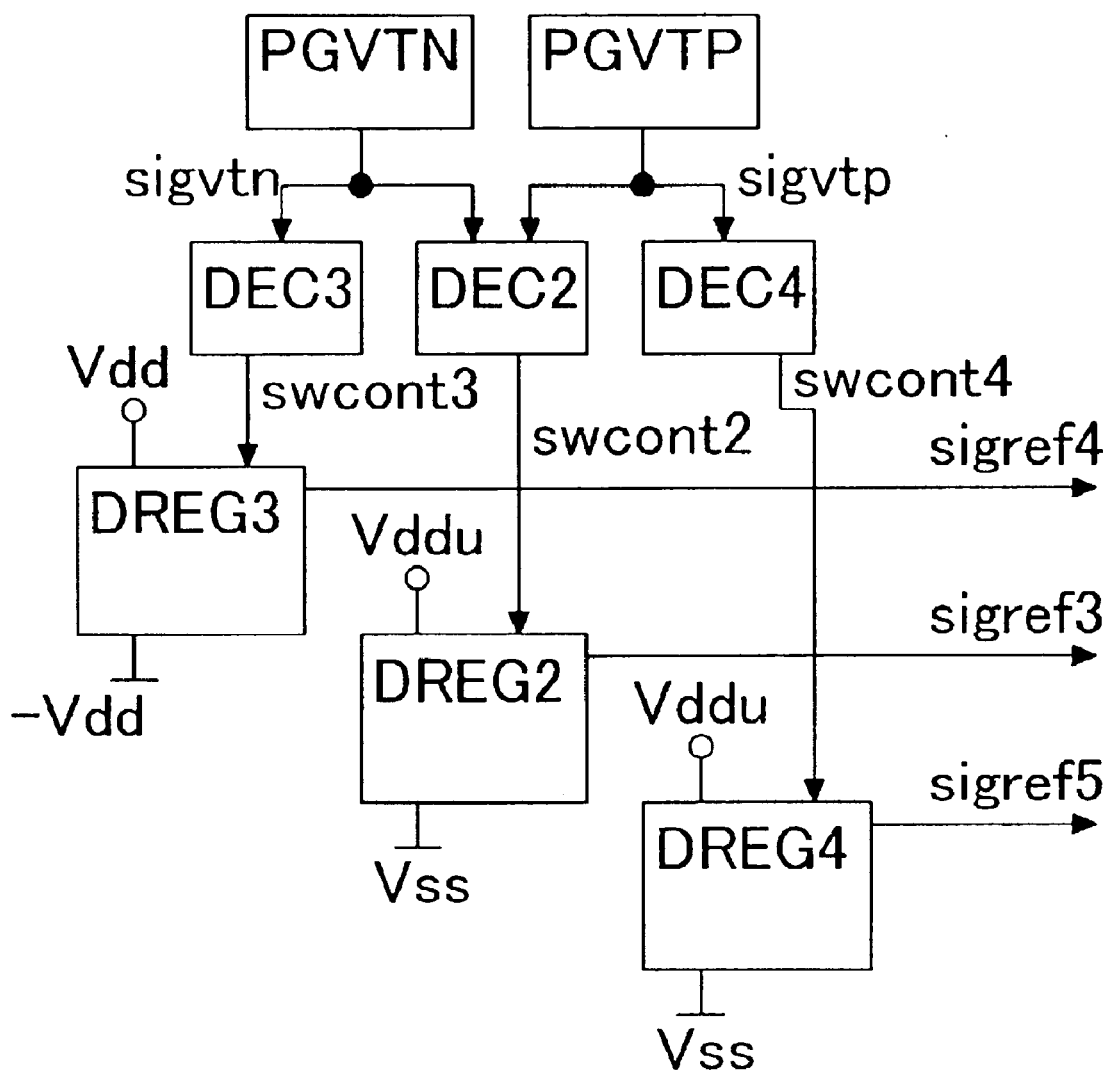
FIG. 12 is a schematic diagram of a circuit for detecting the threshold voltage of a transistor in FIG. 9 and generating a reference potential signal for generating an operating voltage for a memory array and a reference potential signal for generating a substrate potential for the memory array.

FIG. 12 shows the constitution of the circuit DTVT3 for generating sigref5 from the reference potential sigref3. PGVTN and PGVTP are circuits for storing the threshold voltages of the nMOS transistor and pMOS transistor and outputting the threshold voltage of the nMOS transistor as a signal sigvtn and the threshold voltage of the pMOS transistor as a signal sigvtp, respectively. As the memory circuits PGVTN and PGVTP are used nonvolatile memory circuits such as fused circuits or flash memories used for relieving the defects of a memory. The threshold voltages of the MOS transistors are measured at the time of testing an LSI after the production of the LSI and measurement data is written to the memory circuit. DEC2 decodes signals sigvtn and sigvtp, indicative of the threshold voltages of the nMOS transistor and the pMOS transistor, to generate a signal swcont2 for controlling DREG2. DREG2 is a circuit equivalent to the circuit shown in FIG. 8, which divides a potential between Vddu and Vss with a plurality of resistors, selects an appropriate potential from among potentials generated by dividing with the control signal swcont2 and generates a reference potential signal sigref3 for producing an operating voltage Va for the memory array. DEC3 decodes a signal sigvtn indicative of the threshold voltage of the nMOS transistor to generate a signal swcont3 for controlling DREG3. DREG3 is a circuit equivalent to the circuit shown in FIG. 8, which divides the potential between Vdd and −Vdd with a plurality of resistors, selects an appropriate potential from among potentials generated by dividing with the control signal swcont3 and generates a reference potential signal sigref4 for generating a substrate potential Vbn for the nMOS transistors of the memory array. When the substrate potential Vbn of the nMOS transistors is designed to be 0 V and the threshold voltages of the nMOS transistors are higher than this designed value, the decoder circuit DEC3 controls the reference potential to a value higher than 0 V and inflicts the substrate bias voltage in a forward direction to the nMOS transistors to reduce their threshold voltages. On the contrary, when the threshold voltages of the nMOS transistors are lower than the designed value, the decoder circuit DEC3 controls the reference potential to a value lower than 0 V and inflicts the substrate bias voltage in the opposite direction to the nMOS transistors to increase their threshold voltages. Potential −Vdd can be made easily by circuits comprising charge pump, which is generally used in substrate voltage control circuits. When a circuit for controlling a substrate bias voltage is mounted on the same LSI separately from the SRAM circuit, the potential −Vdd could be generated in the circuit, which is possible to use as the potential. DEC4 decodes a signal sigvtp indicative of the threshold voltage of the pMOS transistor and generates a signal swcont4 for controlling DREG4. DREG4 is a circuit equivalent to the circuit shown in FIG. 8, which divides the potential between Vddu and Vss with a plurality of resistors, selects an appropriate potential from among potentials generated by dividing with the control signal swcont4, and outputs a reference potential signal sigref5 for generating a substrate potential Vbp for the pMOS transistor of the memory array. When the substrate potential Vbp of the pMOS transistors are designed to be Vdd and the threshold voltages of the pMOS transistors are higher than this design value, the decoder circuit DEC4 controls the reference potential to a value lower than Vdd and applies the substrate bias voltage in a forward direction to the pMOS transistors to reduce their threshold voltages. On the contrary, when the threshold voltages of the pMOS transistors are lower than the design value, the decoder circuit DEC4 controls the reference potential to a value higher than Vdd and applies the substrate bias voltage in the opposite direction to the pMOS transistors to increase their threshold voltages.

Even when the characteristics of the memory cell in the LSI produced by controlling the substrate bias voltage become such as shown in FIG. 3 or FIG. 4 by using the circuits shown in FIG. 11 and FIG. 12, it is possible to make the characteristics close to those shown in FIG. 2 and further to change the operating voltage of the memory array to a voltage having the largest operation margin.

Figure 13:
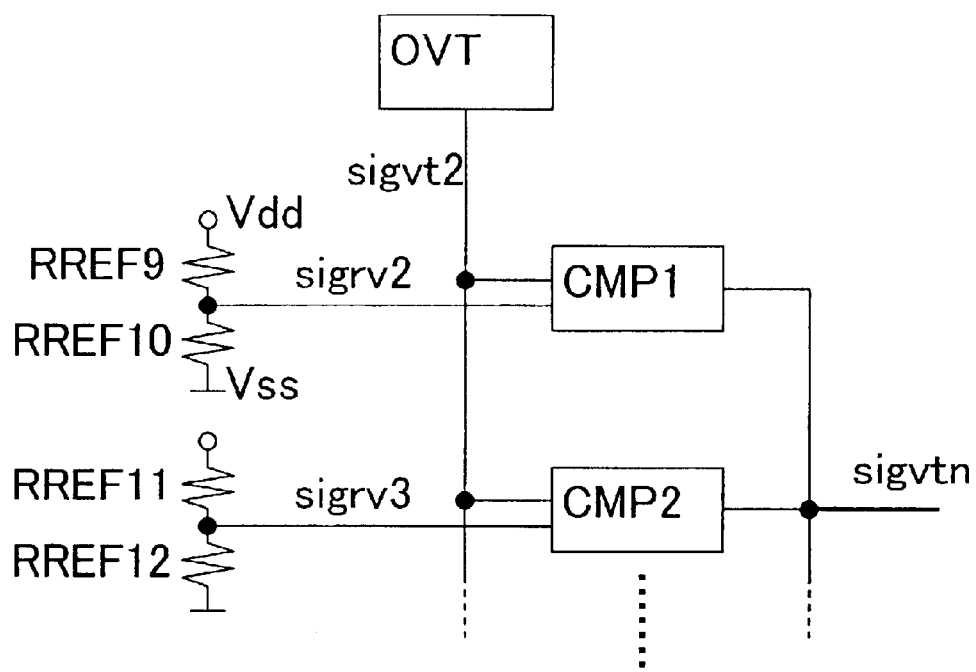
FIG. 13 is a schematic diagram showing an example of a threshold detection circuit for a transistor.

In FIG. 12, the circuits PGVTN and PGVTP are nonvolatile memory circuits for storing measurement data on the threshold voltages of the MOS transistors at the time of testing the LSI after the production of the LSI. They can be replaced by circuits shown in FIG. 13. In FIG. 13, OVT is a circuit for detecting the threshold voltage of a MOS transistor to output it as a signal sigvt2, and CMP1 and CMP2 are circuits for comparing the two input signals to output a high or low signal. In FIG. 13, this circuit generates a reference potential to be compared with the threshold voltage with a plurality of resistors, compares the actual threshold voltage of a transistor with the reference potential for comparison, and outputs the comparison result as a signal SIGVTN for controlling the operating voltage and the substrate bias voltage for the memory array. The signal sigvt2 does not need to output the actual threshold voltage but a voltage which changes according to the threshold voltage.

When sigvtn is, for example, a two-bit signal, the operation of the circuit shown in FIG. 13 is as follows. When the threshold voltage of the transistor is higher than its design value, the potential of sigvt2 becomes higher than the potentials of sigrv2 and sigrv3, and "00" is output as an output signal sigvtn. When the threshold voltage of the transistor is close to its design value, the potential of sigvt2 is lower than the potential of sigrv2 and higher than the potential of sigrv3, and "10" is output as an output signal sigvtn. When the threshold voltage of the transistor is lower than its design value, the potential of sigvt2 becomes lower than the potentials of sigrv2 and sigrv3, and "11" is output as an output signal sigvtn. Since sigvtn is a two-bit signal in this example, the three states of the threshold voltage are detected. By increasing the number of dividing resistors and comparator circuits, a larger number of states of the threshold voltage can be detected, thereby making it possible to control the operating voltage and the substrate bias voltage for of the memory cell array more finely.

When program circuits are used, the characteristics such as threshold voltages of transistors are measured after the production of the LSI and stored in the program circuits, whereby changes in the characteristics of the transistor at the time of producing the LSI can be corrected. However, changes in the characteristics of the transistors caused by varying temperature or the like during the operation of the LSI cannot be corrected. Although the threshold voltages of the transistors are greatly affected and changed by the operating temperature, when the circuit of FIG. 13 is used, the characteristics of the transistors are detected during the operation of the LSI. Therefore, changes in the characteristics of the transistor caused by varying temperature or the like during the operation of the LSI are corrected by using the operating voltage and the substrate bias voltage for the memory array, and the operation margin is made large.

Figure 15:
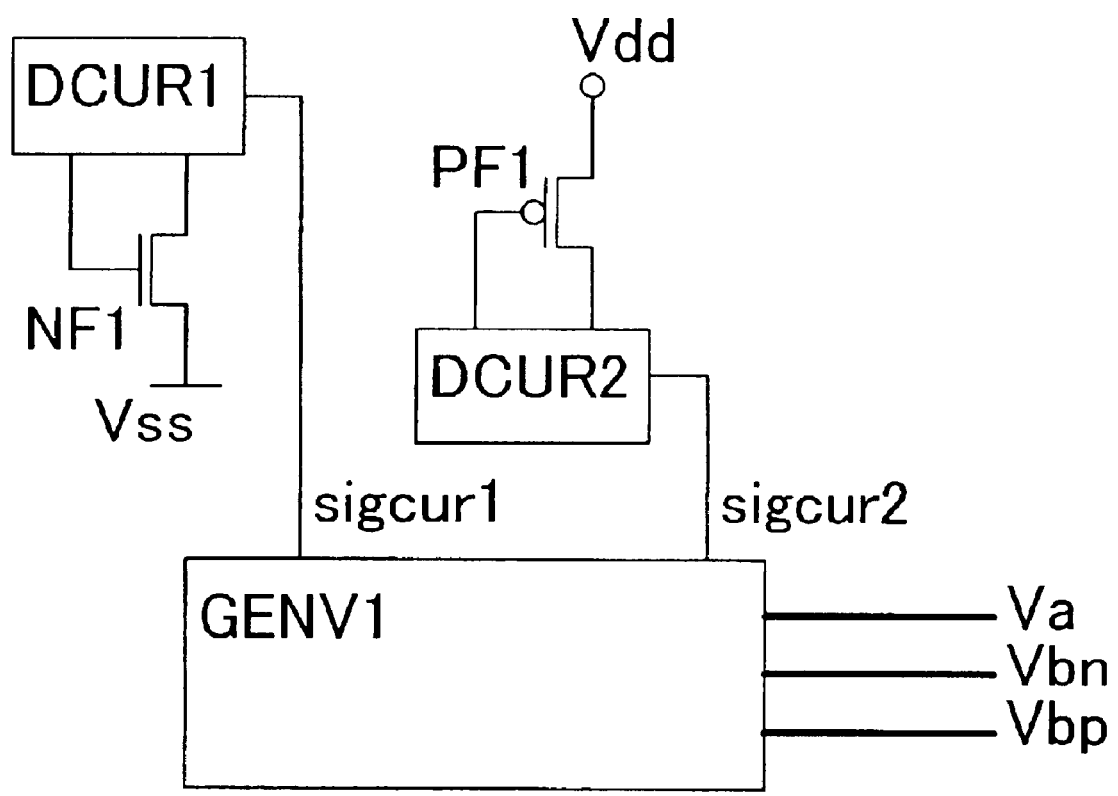
FIG. 15 is a schematic diagram of the power control system of the SRAM circuit.

FIG. 15 is a schematic diagram of the power control system of an SRAM circuit according to the present invention. In FIG. 15, NF1 is an n-channel transistor, PF1 is a p-channel transistor, DCUR1 and DCUR2 are circuits for detecting the currents of the transistors, and GENV1 is a circuit for changing three operating voltages based on input signals. The operation of the circuit shown in FIG. 15 is as follows. The source electrode of the n-channel transistor NF1 is connected to the node of a ground potential Vss, and the current detector circuit DCUR1 controls the gate voltage of NF1 to detect the current of the drain electrode, and outputs a signal sigcur1 for controlling the circuit GENV1 to change operating voltages from the detected current values. The source electrode of the p-channel transistor PF1 is connected to the node of a operating voltage Vdd, and the current detector DCUR2 controls the gate voltage of PF1 to detect the current of the drain electrode, and outputs a signal sigcur2 for controlling the circuit GENV1 for changing operating voltages from the detected current values. GENV1 controls the operating voltage Va of the memory cell, the substrate potential Vbn of the n-channel transistors and the substrate potential Vbp of the p-channel transistors based on the signals sigcur1 and sigcur2. This makes it possible to adjust three different operating voltages based on current characteristics related to the threshold voltages of the n-channel and p-channel transistors.

According to the present invention, it is possible to operate the SRAM circuit under conditions that the operation margin is reduced by increasing the operation margin of the SRAM circuit, particularly at a low voltage of 0.5 V or lower.

What is claimed is:

1. A semiconductor memory device comprising:
   a memory array comprising a plurality of static memory cells;
   a peripheral circuit to control said memory array, said peripheral circuit including at least one of a sense amplifier and a word driver; and
   a first circuit to change an operating voltage of said memory array according to threshold voltages of transistors in said static memory cells,
   wherein the operating voltage of said memory array is different from an operating voltage of said peripheral circuit.

2. The semiconductor memory device of claim 1, wherein each of the static memory cells has two pMOS transistors and four nMOS transistors.

3. A semiconductor memory device, comprising:
   a memory array comprising a plurality of static memory cells;
   a peripheral circuit controlling said memory array; and
   a first circuit changing an operating voltage of said memory array according to threshold voltages of transistors in said static memory cells,
   wherein said first circuit comprises a voltage increasing circuit and a voltage reducing circuit, and is supplied with an operating voltage of said peripheral circuit, and outputs a voltage different from the operating voltage for the peripheral circuit to said memory array.

4. A semiconductor memory device, comprising:
   a memory array comprising a plurality of static memory cells;
   a peripheral circuit controlling said memory array; and
   a first circuit changing an operating voltage of said memory array according to threshold voltages of transistors in said static memory cells,
   wherein the first circuit comprises at least one of a voltage reducing or voltage increasing circuit, is supplied with an operating voltage of the peripheral circuit and an operating voltage higher than the operating voltage for the peripheral circuit, and inflicts a voltage different from the operating voltage of said peripheral circuit to the memory array.

5. A semiconductor memory device, comprising:
   a memory array comprising a plurality of static memory cells;
   a peripheral circuit controlling said memory array; and
   a first circuit changing an operating voltage of said memory array according to threshold voltages of transistors in said static memory cells,
   wherein the first circuit includes a p-channel transistor and an n-channel transistor whose threshold voltages change according to the threshold voltages of transistors in said static memory cells, detects the difference between the threshold voltage of the p-channel transistor and the threshold voltage of the n-channel transistor, and adds the difference to the operating voltage of the peripheral circuit as the operation voltage of the memory array.

6. A semiconductor memory device, comprising:
   a memory array comprising a plurality of static memory cells;
   a peripheral circuit controlling said memory array; and
   a first circuit changing an operating voltage of said memory array according to threshold voltages of transistors in said static memory cells,
   wherein the first circuit comprises a voltage generating circuit for generating a voltage based on said threshold voltages and voltage supply circuit for supplying an operating voltage to the memory array,
   wherein the voltage generating circuit receives a voltage from the peripheral circuit, and
   wherein the voltage supply circuit receives input from the voltage generating circuit and outputs a voltage higher than the operating voltage of said peripheral circuit to the memory array.

7. The semiconductor memory device according to claim 6,
   wherein the voltage generating circuit has a first current source, a second current source, a p-channel transistor having a gate electrode connected to a drain electrode, and an n-channel transistor having a gate electrode connected to the source electrode of the p-channel transistor,
   wherein the gate electrode of the p-channel transistor is connected to the power line of the operating voltage of the peripheral circuit,
   wherein the source electrode of the p-channel transistor is connected to the substrate of the p-channel transistor and said second current source,
   wherein the drain electrode of the n-channel transistor is connected to the first current source,
   wherein the source electrode of the n-channel transistor is connected to the substrate of the n-channel transistor and to the second current source,
   wherein the potential of the source electrode of the n-channel transistor is the output of the voltage generating circuit.

8. The semiconductor memory device according to claim 7,
   wherein a current passing through the first current source is equal to a current passing through the second current source.

9. The semiconductor memory device according to claim 6,
   wherein the voltage generating circuit includes a n-channel transistor and a p-channel transistor and has a circuit for storing the threshold voltages of the n-channel transistor and the p-channel transistor, and
   wherein the voltage supply circuit has a circuit for outputting an operating voltage of the memory array using information stored in said circuit for storing the threshold voltages.

10. The semiconductor memory device according to claim 6,
    wherein the voltage generating circuit has a circuit changing an output potential according to the threshold voltage of a transistor, a circuit outputting a reference potential to be compared with the threshold voltage, and a circuit comparing the threshold of the transistor with the reference potential.

11. A semiconductor memory device comprising:

a memory array comprising a plurality of static memory cells;

a peripheral circuit for controlling said memory array;

a first power line for supplying power to the memory array;

a second power line for supplying power to the peripheral circuit; and a circuit for changing an operating voltage of the memory array according to the threshold voltages of transistors in said static memory cells, wherein the first power line and the second power line are separated from each other, and the first power line is connected to the memory array and said circuit.

12. A semiconductor memory device comprising:

a memory array comprising a plurality of static memory cells;

a peripheral circuit for controlling the memory array; and a second circuit for controlling an operating voltage of the memory array and substrate voltage of transistors constituting the memory array according to the threshold voltages of transistors used in said static memory cells.

13. The semiconductor memory device according to claim 12, wherein the memory cell includes a n-channel transistor and a p-channel transistor, and wherein the second circuit comprises a circuit storing the threshold voltages of the n-channel transistor and the p-channel transistor, and a circuit outputting an operating voltage of the memory array and substrate voltage of transistors constituting the memory array using information stored in circuits for storing the threshold voltages.

14. The semiconductor memory device according to claim 12, wherein the second circuit has a circuit detecting the threshold voltages of the n-channel transistor and the p-channel transistor, and a circuit outputting an operating voltage of the memory array and substrate voltage of the transistors constituting the memory array using the detected threshold voltages.

15. The semiconductor memory device according to claim 12, wherein the memory cell has first and second n-channel drive transistors, first and second p-channel load transistors, and first and second n-channel transfer transistors, the substrate voltages of the first and second n-channel drive transistors and the first and second n-channel transfer transistors are controlled by the same signal line.

16. The semiconductor memory device according to claim 12, wherein the semiconductor memory device comprises an n-channel transistor, a p-channel transistor, a circuit detecting a current passing through the n-channel transistor, a circuit detecting a current passing through the p-channel transistor, and a circuit changing an operating voltage, substrate voltage of the n-channel transistor and substrate voltage of the p-channel transistor with reference to the amounts of currents detected by the two circuits.

* * * * *